US010826282B2

(12) United States Patent
Cao et al.

(10) Patent No.: US 10,826,282 B2
(45) Date of Patent: Nov. 3, 2020

(54) COPPER BAR COMPONENT FOR SWITCHING INPUT/OUTPUT MODE OF UNINTERRUPTIBLE POWER SUPPLY, AND POWER SYSTEM

(71) Applicant: Huawei Technologies Co., Ltd., Shenzhen (CN)

(72) Inventors: Weijie Cao, Xi'an (CN); Lijun Zhao, Xi'an (CN); Qi Ma, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/382,576

(22) Filed: Apr. 12, 2019

(65) Prior Publication Data

US 2019/0237948 A1    Aug. 1, 2019

Related U.S. Application Data

(63) Continuation of application No. PCT/CN2017/105548, filed on Oct. 10, 2017.

(30) Foreign Application Priority Data

Oct. 12, 2016    (CN) .......................... 2016 1 0892029
Dec. 20, 2016    (CN) ..................... 2016 2 1402624 U

(51) Int. Cl.
*H05K 7/14*    (2006.01)
*H02B 1/20*    (2006.01)
(Continued)

(52) U.S. Cl.
CPC ................. *H02B 1/20* (2013.01); *H02B 1/26* (2013.01); *H02J 9/06* (2013.01); *H05K 7/1432* (2013.01);
(Continued)

(58) Field of Classification Search
None
See application file for complete search history.

(56) References Cited

U.S. PATENT DOCUMENTS 6,442,017 B1 *    8/2002    Ewing ..................... G06F 1/189
174/38
7,781,914 B2    8/2010    Kotlyar et al.
(Continued)

FOREIGN PATENT DOCUMENTS

CN    2196833 Y    5/1995
CN    2293910 Y    10/1998
(Continued)

OTHER PUBLICATIONS

Machine Translation and Abstract of Chinese Publication No. CN2196833, May 10, 1995, 4 pages.
(Continued)

*Primary Examiner* — Courtney L Smith
(74) *Attorney, Agent, or Firm* — Conley Rose, P.C.

(57) ABSTRACT

A copper bar component for switching an input/output mode of an uninterruptible power supply (UPS), and a power system includes an enclosure of the UPS, at least one bracket and a plurality of copper bars. The plurality of copper bars are fastened to each of the at least one bracket, and the plurality of copper bars are connected to an input or output wiring terminal on the enclosure of the UPS. Each of the at least one bracket is made of an insulating material. The plurality of copper bars are arranged on each of the at least one bracket according to one input mode or output mode of the UPS, and the plurality of copper bars are arranged on the at least one bracket in a one-to-one correspondence to at least one of an input mode or an output mode of the UPS.

20 Claims, 5 Drawing Sheets

(51) Int. Cl.
*H02B 1/26* (2006.01)
*H02J 9/06* (2006.01)
(52) U.S. Cl.
CPC ......... *H05K 7/1457* (2013.01); *H05K 7/1492* (2013.01)

(56) References Cited

U.S. PATENT DOCUMENTS

| | | | | |
|---|---|---|---|---|
| 8,223,476 | B2* | 7/2012 | Zhang | H02B 1/20 |
| | | | | 174/54 |
| 8,659,881 | B2* | 2/2014 | Tsai | G06F 1/189 |
| | | | | 361/624 |
| 8,987,618 | B2* | 3/2015 | Thompson | H01H 11/00 |
| | | | | 200/50.03 |
| 9,049,796 | B2* | 6/2015 | Qiu | H05K 7/1457 |
| 9,300,117 | B2* | 3/2016 | Andersen | H02B 1/20 |
| 10,177,675 | B2* | 1/2019 | Numakura | H02M 7/003 |
| 2005/0164563 | A1 | 7/2005 | Schuttler et al. | |
| 2011/0080693 | A1 | 4/2011 | Tsai et al. | |
| 2013/0319831 | A1* | 12/2013 | Thompson | H01H 31/32 |
| | | | | 200/50.27 |

FOREIGN PATENT DOCUMENTS

| | | |
|---|---|---|
| CN | 202103565 U | 1/2012 |
| CN | 205029275 U | 2/2016 |
| JP | 2011182504 A | 9/2011 |

OTHER PUBLICATIONS

Machine Translation and Abstract of Chinese Publication No. CN2293910, Oct. 7, 1998, 6 pages.
Machine Translation and Abstract of Chinese Publication No. CN202103565, Jan. 4, 2012, 6 pages.
Machine Translation and Abstract of Chinese Publication No. CN205029275, Feb. 10, 2016, 5 pages.
Machine Translation and Abstract of Japanese Publication No. JP2011182504, Sep. 15, 2011, 6 pages.
Foreign Communication From a Counterpart Application, PCT Application No. PCT/CN2017/105548, English Translation of International Search Report dated Jan. 15, 2018, 2 pages.
Foreign Communication From a Counterpart Application, PCT Application No. PCT/CN2017/105548, English Translation of Written Opinion dated Jan. 15, 2018, 4 pages.
Foreign Communication From a Counterpart Application, European Application No. 17860507.7, Extended European Search Report dated Aug. 29, 2019, 9 pages.

* cited by examiner

Enclosure 500 of a UPS

Enclosure 600 of a UPS

COPPER BAR COMPONENT FOR SWITCHING INPUT/OUTPUT MODE OF UNINTERRUPTIBLE POWER SUPPLY, AND POWER SYSTEM

CROSS-REFERENCE TO RELATED APPLICATIONS

This application is a continuation of International Application No. PCT/CN2017/105548, filed on Oct. 10, 2017, which claims priority to Chinese Patent Application No. 201610892029.4, filed on Oct. 12, 2016 and Chinese Patent Application No. 201621402624.7, filed on Dec. 20, 2016. The disclosures of the aforementioned applications are hereby incorporated by reference in their entireties.

TECHNICAL FIELD

This application relates to the communications field, and in particular, to a copper bar component for switching an input/output mode of an uninterruptible power supply, and a power system.

BACKGROUND

An uninterruptible power supply, also referred to as an uninterruptible power system (UPS) is a system device that can connect a storage battery and a host, and convert a direct current into a mains supply by using a modular circuit such as an inverter of the host; and is mainly used to supply stable and uninterrupted electric power to a standalone computer, a computer network system, or another electric or electronic device such as a solenoid valve or a pressure transducer. When mains input is normal, the UPS regulates a voltage of the mains supply and provides the mains supply to a load for use. In this case, the UPS is a voltage regulator for an alternating current mains supply, and may further charge a built-in battery at the same time. When the mains supply is interrupted (due to forced power outage), the UPS immediately continues to supply a 220 Volt (V) alternating current to the load by using direct current electric energy of the battery by means of a zero-delay switching method using an inverter circuit, so that the load maintains normal operation, and software and hardware of the load are protected against damage. A UPS can provide protection regardless whether a voltage is excessively high or excessively low.

An input/output mode of the UPS includes single-phase and three-phase modes. To meet application requirements in different scenarios, besides switching recognition inside the UPS using hardware or software, a single-phase or three-phase conversion apparatus is also required at an input wiring terminal and an output wiring terminal of the UPS. A relatively commonly used method is to short-circuit ports of the UPS using a copper bar, thereby implementing switching between the three-phase mode and the single-phase mode. However, the UPS has a bypass. Therefore, wiring of input ports or output ports is relatively complex, and switching between the three-phase and single-phase input/output modes needs to be implemented by means of a short-circuit solution using copper bars of various models.

In an example, the UPS can support four input/output modes: three-phase input three-phase output, main path/bypass single-sourcing; three-phase input three-phase output, main path/bypass different-sourcing; three-phase input single-phase output, main path/bypass single-sourcing; and three-phase input single-phase output, main path/bypass different-sourcing. FIG. 1 shows a schematic diagram of a copper bar connection mode when a UPS is in the three-phase input three-phase output, main path/bypass single-sourcing mode. Generally, the three-phase input three-phase output, main path/bypass single-sourcing mode shown in FIG. 1 is used by default when the UPS is delivered from a factory. In the figure, mA, mB, mC, and mN represent main path input ports; bA, bB, bC, and bN represent bypass input ports; oA, oB, oC, and oN represent output ports; Bat+, Bat N, and Bat− represent power interfaces; and PE represents a ground port. When the input/output mode in factory settings of the UPS cannot meet an application requirement of a scenario, a user needs to manually replace copper bars one by one, to adapt to the application requirement of the scenario. FIG. 2 shows a schematic diagram of a copper bar connection mode when a UPS is in the three-phase input single-phase output, main path/bypass single-sourcing mode. It should be understood that parts in FIG. 2 that are the same as those in FIG. 1 use same sign descriptions as those for FIG. 1. Details are not described herein again. In comparison with the copper bar connection mode shown in FIG. 1, in the copper bar connection mode shown in FIG. 2, a user needs to manually dismount four factory-default No. 3 copper bars of the UPS in FIG. 1, and then fasten a total of six types of copper bars shown in FIG. 2 to an enclosure of the UPS using screws: two No. 4 copper bars, one No. 5 copper bar, one No. 6 copper bar, one No. 7 copper bar, one No. 8 copper bar, and one No. 10 copper bar. In the foregoing UPS input/output mode switching process, the copper bars are manually replaced one by one by the user. Therefore, a copper bar may be missed out and not replaced or a copper bar short-circuit error may occur in the copper bar replacement process. In this case, UPS explosion may be caused, and a risk thereof is uncontrollable.

SUMMARY

This application intends to provide an improved solution for switching an input/output mode of a UPS, to resolve a problem of a relatively high error rate of operations such as copper bar replacement and copper bar short-circuit during the switching of the input/output mode of the UPS.

According to a first aspect, this application provides a copper bar component for switching an input/output mode of an uninterruptible power supply UPS. The UPS includes an enclosure of the UPS, an input or output wiring terminal is disposed on the enclosure of the UPS, and the input or output wiring terminal is in a single-phase or three-phase mode. The copper bar component includes at least one bracket and a plurality of copper bars, the plurality of copper bars are fastened to each of the at least one bracket, and the plurality of copper bars are connected to the input or output wiring terminal on the enclosure of the UPS. Each bracket is made of an insulating material. An arrangement manner of the plurality of copper bars on the at least one bracket is in a one-to-one correspondence to at least one input or output mode of the UPS, so as to switch the input or output mode of the UPS by replacing the copper bar component. The input mode of the UPS includes a single-phase or three-phase input mode, and the output mode of the UPS includes a single-phase or three-phase output mode.

The input or output wiring terminal in a single-phase or three-phase mode may mean that the input wiring terminal may be in a single-phase or three-phase input mode after being short-circuited using the plurality of copper bars, and that the output wiring terminal may be in a single-phase or three-phase output mode after being short-circuited using the plurality of copper bars.

The plurality of copper bars are fastened into an assembly by using the bracket according to an arrangement manner corresponding to any input or output mode of the UPS, to form the copper bar component. A user may fasten the plurality of copper bars onto the enclosure of the UPS in a form of a copper bar component, to avoid prior-art risks of a copper bar replacement miss-out and a copper bar short-circuit error that are generated when the user manually disassembles or assembles a plurality of copper bars, thereby improving accuracy of copper bar replacement when the user switches the input/output mode of the UPS.

With reference to the first aspect, in a possible implementation of the first aspect, a limiting hole is disposed on each of the plurality of copper bars, and a protruding part is disposed on each bracket; and the plurality of copper bars are fastened to each bracket by means of fitting between the limiting hole disposed on each copper bar and the protruding part disposed on each bracket.

A copper bar component-based structural design is implemented by means of the fitting between the protruding part disposed on the bracket and the limiting hole disposed on the copper bar, which helps simplify an operation of on-site copper bar replacement by the user and improves efficiency of switching the input/output mode of the UPS.

With reference to either of the first aspect or the foregoing possible implementation, in another possible implementation of the first aspect, each bracket includes an upper bracket and a lower bracket, the protruding part is disposed on the upper bracket, and a limiting hole is disposed on the lower bracket; and the upper bracket is connected to the plurality of copper bars by using the protruding part, and the plurality of copper bars are fastened between the upper bracket and the lower bracket by means of fitting with the limiting hole disposed on the lower bracket.

The copper bars are fastened between the upper bracket and the lower bracket by means of the fitting between the protruding part disposed on the upper bracket and the limiting hole disposed on the lower bracket, thereby improving the stability of a connection between the bracket and the copper bar.

With reference to the first aspect, in another possible implementation of the first aspect, a label is disposed on each bracket, and the label is used to indicate an input or output mode, corresponding to each bracket, of the UPS.

The label is disposed on the bracket, so that the user can identify the input/output mode corresponding to the UPS, thereby reducing complexity of switching the input/output mode of the UPS by the user and improving the efficiency of switching the input/output mode of the UPS.

With reference to either of the first aspect or the foregoing possible implementation of the first aspect, in another possible implementation of the first aspect, a foolproof structure is disposed on the at least one bracket and/or the enclosure of the UPS.

The foolproof structure is disposed on the at least one bracket and/or the enclosure of the UPS, so as to reduce a probability of incorrectly switching the input/output mode of the UPS by the user.

With reference to either of the first aspect or the foregoing possible implementation of the first aspect, in another possible implementation of the first aspect, a protruding rib is disposed on each bracket, each bracket corresponds to one output mode of the UPS, a groove is disposed on the enclosure of the UPS, and the protruding rib and the groove form a foolproof structure; and the bracket corresponding to the output mode of the UPS and a bracket corresponding to the input mode of the UPS are differentiated by using fitting between the protruding rib of each bracket and the groove disposed on the enclosure of the UPS.

The protruding rib disposed on the bracket corresponding to the output mode of the UPS and the groove disposed on the enclosure of the UPS are used as the foolproof structure, so as to differentiate between the bracket corresponding to the output mode of the UPS and the bracket corresponding to the input mode of the UPS. This prevents the user from installing the bracket corresponding to the output mode to an input port on the enclosure of the UPS, thereby improving accuracy of switching the input/output mode of the UPS by the user.

With reference to either of the first aspect or the foregoing possible implementation of the first aspect, in another possible implementation of the first aspect, a protruding rib is disposed on each bracket, each bracket corresponds to one input mode of the UPS, a groove is disposed on the enclosure of the UPS, and the protruding rib and the groove form a foolproof structure; and a bracket corresponding to the output mode of the UPS and the bracket corresponding to the input mode of the UPS are differentiated by using fitting between the protruding rib of each bracket and the groove disposed on the enclosure of the UPS.

The protruding rib disposed on the bracket corresponding to the input mode of the UPS and the groove disposed on the enclosure of the UPS are used as the foolproof structure, so as to differentiate between the bracket corresponding to the output mode of the UPS and the bracket corresponding to the input mode of the UPS. This prevents the user from installing the bracket corresponding to the input mode to an output port on the enclosure of the UPS, thereby improving the accuracy of switching the input/output mode of the UPS by the user.

With reference to any one of the first aspect or the foregoing possible implementations of the first aspect, in another possible implementation of the first aspect, a boss is disposed on a first bracket that is in the at least one bracket and that corresponds to a first mode of the UPS, a boss is disposed on a second bracket that is in the at least one bracket and that corresponds to a second mode of the UPS, the boss disposed on the first bracket and the boss disposed on the second bracket form a foolproof structure, and the first mode of the UPS is incompatible with the second mode of the UPS.

The boss disposed on the bracket corresponding to the first mode of the UPS and the boss disposed on the bracket corresponding to the second mode of the UPS are used as the foolproof structure. This prevents machine explosion caused by installation of both the bracket corresponding to the first mode and the bracket corresponding to the second mode on the enclosure of the UPS by the user, thereby improving the accuracy of switching the input/output mode of the UPS by the user.

With reference to any one of the first aspect or the foregoing possible implementations of the first aspect, in another possible implementation of the first aspect, the first mode is a three-phase input, main path/bypass single-sourcing mode, and the second mode is the single-phase output mode.

The boss disposed on the bracket corresponding to the three-phase input, main path/bypass single-sourcing mode of the UPS and the boss disposed on the bracket corresponding to the single-phase output mode of the UPS are used as the foolproof structure. This prevents machine explosion caused by installation of both the bracket corresponding to the three-phase input, main path/bypass single-sourcing mode and the bracket corresponding to the single-phase output mode on the enclosure of the UPS by the user, thereby improving the accuracy of switching the input/output mode of the UPS by the user.

With reference to either of the first aspect or the foregoing possible implementation of the first aspect, in another possible implementation of the first aspect, the plurality of copper bars are fastened to each bracket where the plurality of copper bars and each bracket are molded into one using a mold.

In some implementations, the input port of the UPS may be an input wiring terminal of the UPS power supply, and the output port of the UPS power supply may be an output wiring terminal of the UPS power supply.

In this embodiment of the present disclosure, the plurality of copper bars are fastened into an assembly using the bracket in an arrangement manner corresponding to any input or output mode of the UPS, to form the copper bar component. In this way, the user can fasten the plurality of copper bars onto the enclosure of the UPS in the form of the copper bar component, thereby improving the accuracy of switching the input/output mode of the UPS by the user.

According to a second aspect, a power system is provided. The power system includes a UPS and a copper bar component, and the copper bar component includes any copper bar component according to the first aspect.

A plurality of copper bars are fastened into assembly by using a bracket according to an arrangement manner corresponding to any input or output mode of the UPS, to form the copper bar component. A user may fasten the plurality of copper bars onto an enclosure of the UPS in a form of a copper bar component, to avoid prior-art risks of a copper bar replacement miss-out and a copper bar short-circuit error that are generated when the user manually disassembles or assembles a plurality of copper bars, thereby improving accuracy of copper bar replacement when the user switches the input/output mode of the UPS.

DESCRIPTION OF EMBODIMENTS

The following describes technical solutions in embodiments of this application with reference to accompanying drawings.

Figure 1:
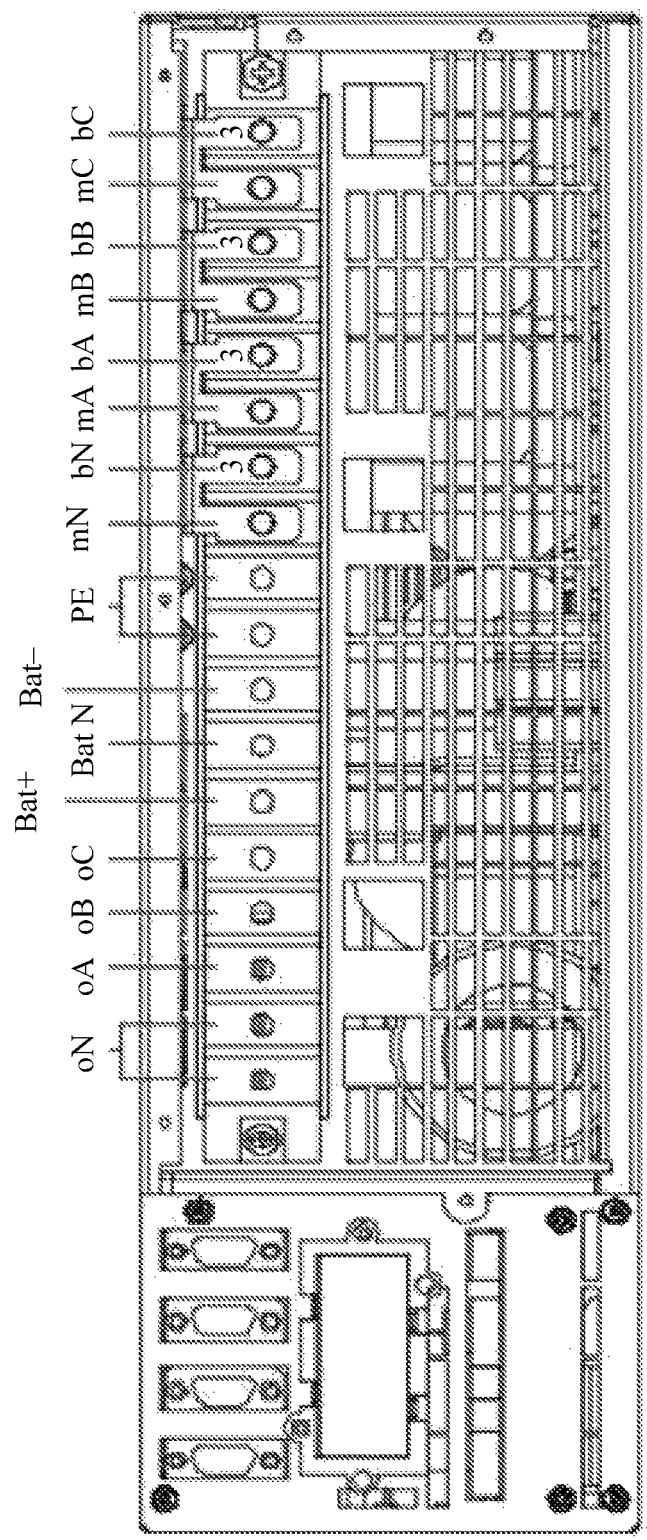
FIG. 1 shows a schematic diagram of a copper bar connection mode when a UPS is in a three-phase input three-phase output, main path/bypass single-sourcing mode.
Figure 2:
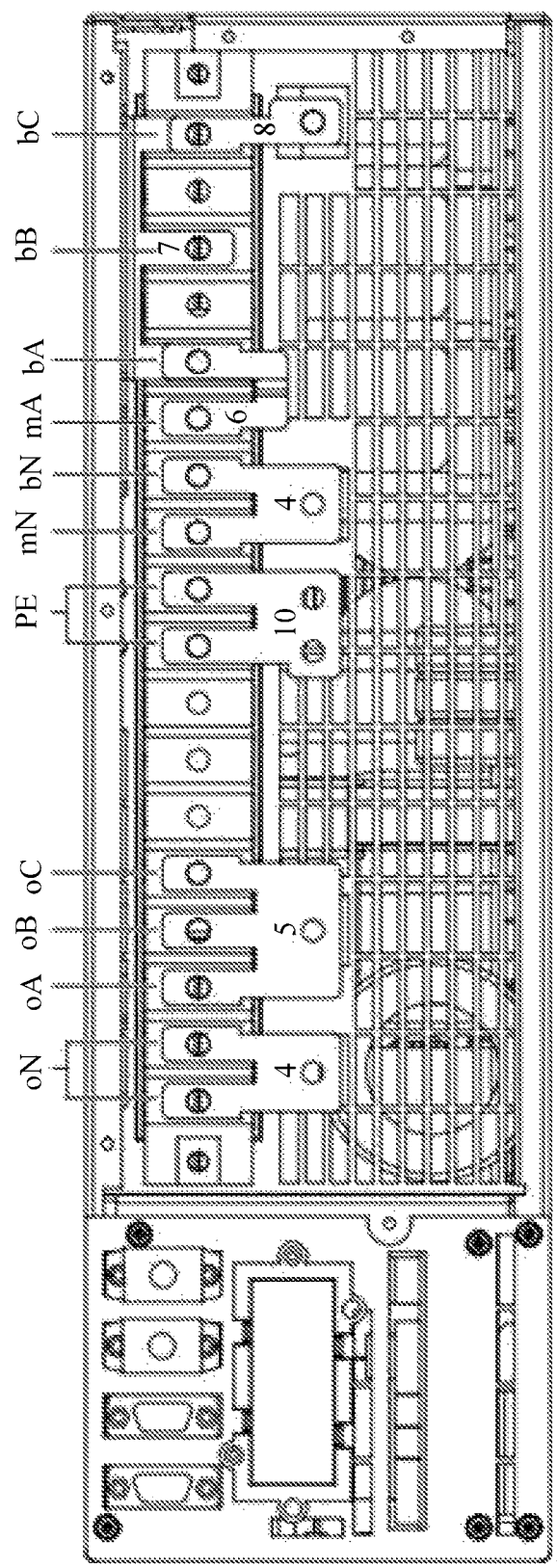
FIG. 2 shows a schematic diagram of a copper bar connection mode when a UPS is in a three-phase input single-phase output, main path/bypass single-sourcing mode.
Figure 3:
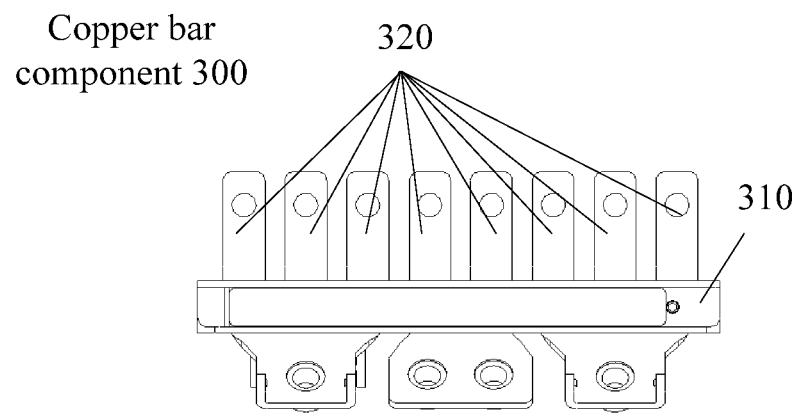
FIG. 3 shows a schematic structural diagram of a copper bar component for switching an input/output mode of a UPS according to an embodiment of this application.

FIG. 3 shows a schematic structural diagram of a copper bar component for switching an input/output mode of a UPS according to an embodiment of this application. A copper bar component 300 shown in FIG. 3 includes at least one bracket 310 and a plurality of copper bars 320. It should be understood that the copper bar component shown in FIG. 3 merely illustrates any bracket of the at least one bracket.

The UPS includes an enclosure of the UPS, an input or output wiring terminal is disposed on the enclosure of the UPS, and the input or output wiring terminal is in a single-phase mode or three-phase mode. The copper bar component 300 includes at least one bracket 310 and the plurality of copper bars 320, the plurality of copper bars 320 are fastened to each of the at least one bracket 310, and the plurality of copper bars 320 are connected to the input or output wiring terminal on the enclosure of the UPS. Each bracket 310 is made of an insulating material. An arrangement manner of the plurality of copper bars 320 on each bracket 310 corresponds to one input or output mode of the UPS, and an arrangement manner of the plurality of copper bars 320 on the at least one bracket 310 is in a one-to-one correspondence to at least one input or output mode of the UPS, so as to switch the input or output mode of the UPS by replacing the copper bar component 300. The input mode of the UPS includes a single-phase or three-phase input mode, and the output mode of the UPS includes a single-phase or three-phase output mode.

The input or output wiring terminal in a single-phase or three-phase mode may mean that the input wiring terminal may be in a single-phase or three-phase input mode after being short-circuited using the plurality of copper bars 320, and that the output wiring terminal may be in a single-phase or three-phase output mode after being short-circuited using the plurality of copper bars 320.

It should be understood that, the plurality of copper bars 320 being fastened to each bracket 310 may mean that the plurality of copper bars 320 and the bracket 310 are molded through insert molding in a plastic mold, or mean that the plurality of copper bars 320 are connected to the bracket 310 by using a connection mechanism such as a screw. A manner of a connection between the bracket 310 and the plurality of copper bars 320 is not specifically limited in this embodiment of this application.

The plurality of copper bars 320 are fastened into an assembly by using the bracket 310 according to an arrangement manner corresponding to any input or output mode of the UPS, to form the copper bar component 300. A user may fasten the plurality of copper bars 320 onto the enclosure of the UPS in a form of a copper bar component 300, to avoid prior-art risks of a copper bar replacement miss-out and a copper bar short-circuit error that are generated when the user manually disassembles or assembles a plurality of copper bars 320, thereby improving accuracy of copper bar replacement when the user switches the input/output mode of the UPS.

Optionally, in an embodiment, a limiting hole is disposed on each of the plurality of copper bars 320, and a protruding part is disposed on each bracket 310; and the plurality of copper bars 320 are fastened to each bracket 310 by means of fitting between the limiting hole disposed on each copper bar and the protruding part disposed on each bracket 310.

In an embodiment, a plurality of limiting holes may be disposed on each copper bar. A distance between two adjacent limiting holes on each copper bar may correspond to a model of the copper bar, for instance, the distance between two adjacent limiting holes on the copper bar varies with the model, so as to reduce a rate of a copper bar installation error caused when a customer fastens the copper bars 320 to the bracket 310.

It should be understood that each copper bar may further have a different limiting hole shape or size so as to differentiate between fastening positions of copper bars of different models on the bracket for instance, limiting holes of different shapes or sizes may be disposed on the copper bars of different models. In addition, a protruding part matching a limiting hole of a copper bar may be disposed on the bracket 310 at an installation position of the corresponding copper bar, to reduce the rate of the copper bar installation error caused when the customer fastens the copper bars 320 to the bracket 310.

It should be further understood that, one limiting hole may be disposed on each copper bar 320. A quantity of limiting holes disposed on each copper bar 320 is not specifically limited in this embodiment of this application.

Optionally, in an embodiment, each bracket 310 includes an upper bracket and a lower bracket. The protruding part is disposed on the upper bracket and a limiting hole is disposed on the lower bracket. The upper bracket is connected to the plurality of copper bars 320 by using the protruding part, and the plurality of copper bars 320 are fastened between the upper bracket and the lower bracket by means of fitting with the limiting hole disposed on the lower bracket.

Optionally, in an embodiment, a label is disposed on each bracket 310, and the label is used to indicate an input or output mode, corresponding to each bracket, of the UPS.

Figure 4:
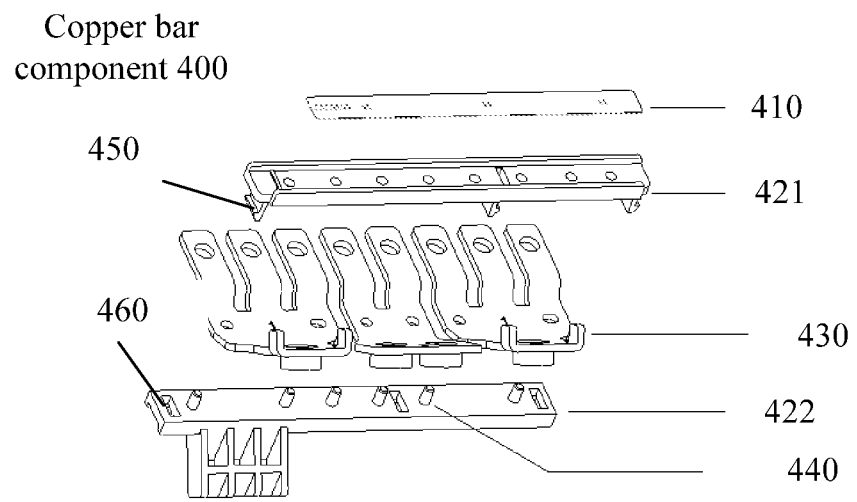
FIG. 4 shows a schematic structural diagram of another copper bar component for switching an input/output mode of a UPS according to an embodiment of this application.

Specifically, FIG. 4 shows a schematic structural diagram of another copper bar component for switching an input/output mode of a UPS according to an embodiment of this application. A copper bar component 400 shown in FIG. 4 includes a label 410, a bracket, a plurality of copper bars 430, and a protruding part 440. The bracket may include an upper bracket 421 and a lower bracket 422. A protruding part 440 disposed on the lower bracket 422 may fit with a limiting hole disposed on a copper bar, to fasten the copper bar 430 to the lower bracket 422. The plurality of copper bars 430 are then fastened between the upper bracket 421 and the lower bracket 422 through fitting between a fastening mechanism 450 disposed on the upper bracket 421 and a fastening hole 460 on the lower bracket 422. The label 410 may be further disposed on the upper bracket 421. The label 410 is used to indicate an input or output mode, corresponding to each bracket, of the UPS, to facilitate identification by a user.

It should be understood that the plurality of copper bars 430 may be further fastened between the upper bracket 421 and the lower bracket 422 using screws. That is, a screw hole may be disposed on the upper bracket 421, and a screw hole may also be disposed on the lower bracket 422 at a position corresponding to that on the upper bracket 421. When the copper bars 430 are fastened to the lower bracket 422 using the protruding part 440 disposed on the lower bracket 422, the upper bracket 421 may be fastened to the lower bracket 422 using a screw, thereby fastening the copper bars 430 between the upper bracket 421 and the lower bracket 422. A connection relationship between the upper bracket 421 and the lower bracket 422 is not specifically limited in this embodiment of this application.

It should be further understood that, the foregoing label 410 may be fastened to the upper bracket 421 by means of sticking, or may be a label integrally molded on the bracket 421 when the bracket 421 is molded using a plastic mold. A specific form of the label 410 and a manner of a connection between the label 410 and the bracket 421 are not specifically limited in this embodiment of this application.

Optionally, in an embodiment, a foolproof structure is disposed on the at least one bracket and/or the enclosure of the UPS.

It should be understood that, a groove may be disposed on a specific type of bracket in the at least one bracket and a protruding part may be disposed on the enclosure of the UPS, and the groove and the protruding part may fit with each other to form a foolproof structure. Alternatively, a protruding part may be disposed on a specific type of bracket in the at least one bracket and a groove may be disposed on the enclosure of the UPS, and the groove and the protruding part may fit with each other to form a foolproof structure. Alternatively, a protruding part may be disposed on a first specific type of bracket in the at least one bracket and a protruding part may be disposed on a second specific type of bracket in the at least one bracket, and a foolproof structure is formed by using the protruding part on the first type of bracket and the protruding part on the second type of bracket. An input/output mode corresponding to the first type of bracket is incompatible with an input/output mode corresponding to the second type of bracket. A form of the foregoing foolproof structure is not specifically limited in this application.

Optionally, in an embodiment, a protruding rib 520 is disposed on each bracket, each bracket corresponds to one output mode of the UPS, a groove is disposed on the enclosure of the UPS, and the protruding rib and the groove form a foolproof structure. The bracket corresponding to the output mode of the UPS and a bracket corresponding to the input mode of the UPS are differentiated by using fitting between the protruding rib of each bracket and the groove disposed on the enclosure of the UPS.

Optionally, in an embodiment, a protruding rib 520 is disposed on each bracket, each bracket corresponds to one input mode of the UPS, a groove is disposed on the enclosure of the UPS, and the protruding rib and the groove form a foolproof structure. A bracket corresponding to the output mode of the UPS and the bracket corresponding to the input mode of the UPS are differentiated by using fitting between the protruding rib of each bracket and the groove disposed on the enclosure of the UPS.

Figure 5:
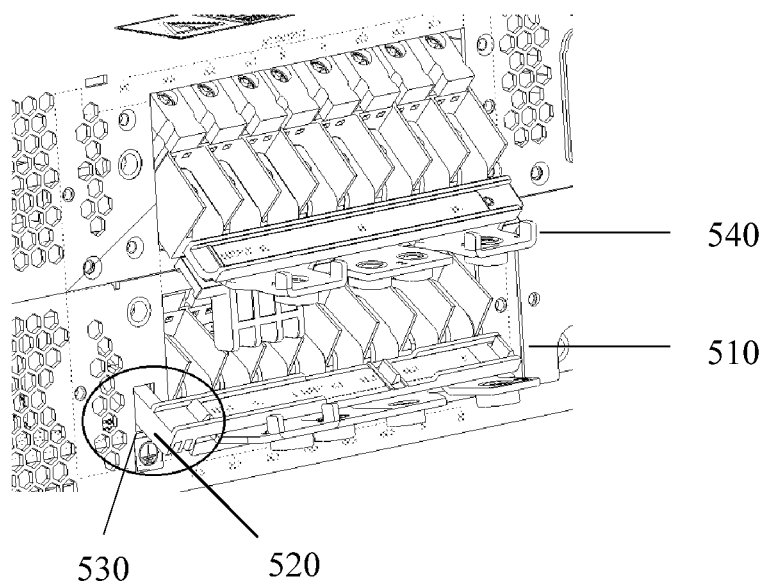
FIG. 5 shows a schematic structural diagram of a foolproof structure on an enclosure of a UPS according to an embodiment of this application.

Specifically, FIG. 5 shows a schematic structural diagram of a foolproof structure on an enclosure of a UPS according to an embodiment of this application. In an example shown in FIG. 5, a foolproof structure on an enclosure 500 of the UPS is disposed on a bracket corresponding to an input mode of the UPS. It should be understood that, alternatively, the foolproof structure may be disposed on a bracket corresponding to an output mode of the UPS. As shown in FIG. 5, a protruding rib 520 is disposed on a bracket 510 of a copper bar component corresponding to an input port of the UPS, and a groove 530 is disposed on the enclosure of the UPS. The foregoing protruding rib and groove form the foolproof structure. When the copper bar component corresponding to the input port is to be installed on an output port of the UPS due to a user error, the copper bar component of the foregoing input port cannot be installed at a position of a copper bar component of the output port of the UPS because of the protruding rib disposed on the copper bar component corresponding to the input port. This prevents the user from mixing up the copper bar component corresponding to the input port of the UPS and the copper bar component corresponding to the output port of the UPS.

It should be understood that, alternatively, the foregoing foolproof structure may be disposed on a copper bar component 540 corresponding to an output port. That is, a groove near the output port on the enclosure of the UPS fits with a protruding rib disposed on the copper bar component corresponding to the output port, to prevent a user from mixing up the copper bar component of the input port of the UPS and the copper bar component of the output port of the UPS. A position of the foregoing foolproof structure is not specifically limited in this embodiment of this application.

It should be further understood that, the foolproof structure shown in FIG. 5 is illustrated as a rectangle merely as an example. Alternatively, a cross section of the protruding rib in the foregoing foolproof structure may be in a circular shape or the like. A shape of the protruding rib and a shape of the groove are not specifically limited in this embodiment of this application.

Optionally, in an embodiment, a boss 620 is disposed on a first bracket that is in the at least one bracket and that corresponds to a first mode of the UPS, a boss 630 is disposed on a second bracket that is in the at least one bracket and that corresponds to a second mode of the UPS, the boss disposed on the first bracket and the boss disposed on the second bracket form a foolproof structure, and the first mode of the UPS is incompatible with the second mode of the UPS.

Figure 6:
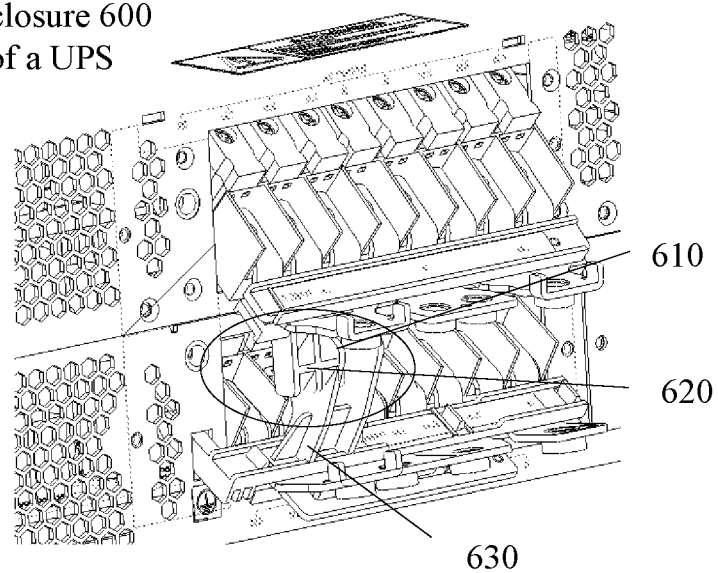
FIG. 6 shows a schematic structural diagram of another foolproof structure on an enclosure of a UPS according to an embodiment of this application.

Specifically, FIG. 6 shows a schematic structural diagram of another foolproof structure on an enclosure of a UPS according to an embodiment of this application. It can be seen from an enclosure 600 of the UPS shown in FIG. 6 that, when a copper bar component installed on an output port of the UPS does not match a copper bar component to be installed on an input port of the UPS, that is, when an output mode corresponding to the copper bar component of the output port is incompatible with an input mode corresponding to the copper bar component of the input port, an interference phenomenon (referring to 610 shown in FIG. 6) occurs on a boss 620 disposed on the copper bar component installed on the output port and a boss 630 disposed on the copper bar component installed on the input port. Therefore, the copper bar component corresponding to the input mode and the copper bar component corresponding to the output mode incompatible with the input mode cannot be simultaneously installed on the UPS.

It should be understood that, alternatively, the bosses forming the foolproof structure may be another protruding structure. A structure and a shape of the boss are not specifically limited in this embodiment of this application.

Optionally, in an embodiment, the first mode is a three-phase input, main path/bypass single-sourcing mode, and the second mode is the single-phase output mode.

Figure 7:
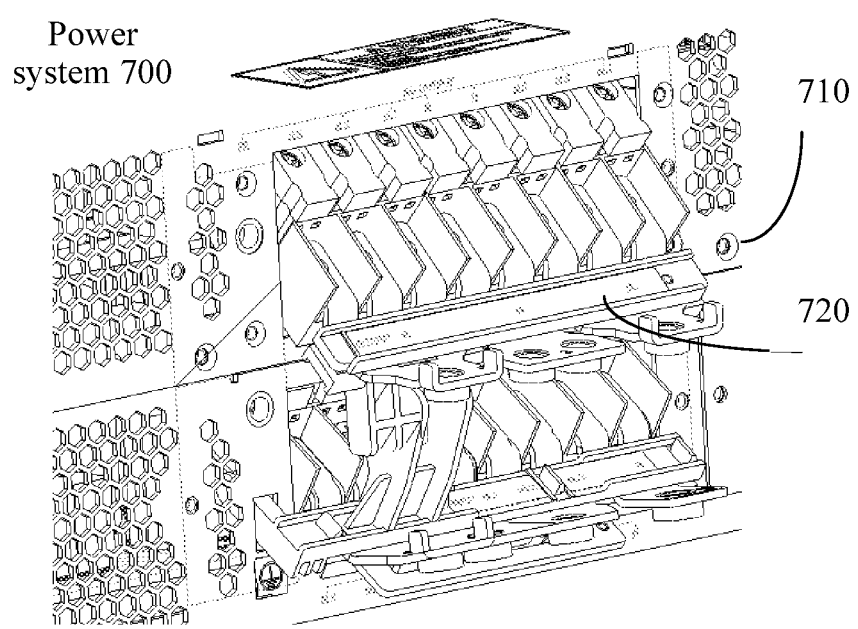
FIG. 7 shows a schematic diagram of a power system according to an embodiment of this application.

FIG. 7 shows a schematic diagram of a power system according to an embodiment of this application. A power system 700 shown in FIG. 7 includes a UPS 710 and a copper bar component 720. It should be understood that, the foregoing copper bar component 720 may include any of the copper bar components shown in FIG. 3 to FIG. 6. For brevity, details are not described herein again.

In the several embodiments provided in this application, it should be understood that the disclosed system, apparatus and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces, indirect couplings or communication connections between the apparatuses or units, or electrical connections, mechanical connections, or connections in other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this application or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present disclosure. The foregoing storage medium includes any medium that can store program code, such as a universal serial bus (USB) flash drive, a removable hard disk, a read-only memory (ROM), a random access memory (RAM), a magnetic disk, or an optical disc.

What is claimed is:

1. A copper bar component for switching an input mode or an output mode of an uninterruptible power supply (UPS), wherein the copper bar component comprises:
   at least one bracket, wherein the at least one bracket is made of an insulating material and comprises at least one protruding part; and
   a plurality of copper bars, wherein the plurality of copper bars are fastened to the at least one bracket, wherein the plurality of copper bars are configured to connect to an input wiring terminal or an output wiring terminal, wherein the input wiring terminal and the output wiring terminal are disposed on an enclosure of the UPS, wherein the at least one protruding part is configured to be selectively coupled to a limiting hole on each of the plurality of copper bars, wherein an arrangement manner of the plurality of copper bars on the at least one bracket corresponds to the at least one input mode or one output mode of the UPS so as to switch the at least one input mode or one output mode of the UPS by replacing the copper bar component, and wherein the input mode is a single-phase input mode or a three-phase input mode, or wherein the output mode is a single-phase output mode or a three-phase output mode.

2. The copper bar component of claim 1, wherein the plurality of copper bars are fastened to the at least one bracket by means of a fitting between the limiting hole disposed on each of the plurality of copper bars and the protruding part disposed on the at least one bracket.

3. The copper bar component of claim 2, wherein the at least one bracket comprises an upper bracket and a lower bracket, wherein the protruding part is disposed on the upper bracket, wherein the limiting hole is disposed on the lower bracket, wherein the upper bracket is connected to the plurality of copper bars by using the protruding part, and wherein the plurality of copper bars are fastened between the upper bracket and the lower bracket by means of the fitting.

4. The copper bar component of claim 1, further comprising a label disposed on the at least one bracket, wherein the label indicates the input mode or the output mode corresponding to the at least one bracket of the UPS.

5. The copper bar component of claim 1, further comprising a foolproof structure disposed on at least one of the at least one bracket or the enclosure.

6. The copper bar component of claim 1, further comprising a protruding rib disposed on the at least one bracket, wherein the at least one bracket corresponds to one output mode of the UPS, wherein a groove is disposed on the enclosure, wherein the protruding rib and the groove form a foolproof structure, and wherein the output mode and the input mode are differentiated by using a fitting between the protruding rib of the at least one bracket and the groove disposed on the enclosure.

7. The copper bar component of claim 1, further comprising a protruding rib disposed on the at least one bracket, wherein the at least one bracket corresponds to one input mode of the UPS, wherein a groove is disposed on the enclosure, wherein the protruding rib and the groove form a foolproof structure, and wherein the output mode and the input mode are differentiated by using a fitting between the protruding rib of the at least one bracket and the groove disposed on the enclosure.

8. The copper bar component of claim 1, further comprising:
a first boss disposed on a first bracket of the at least one bracket that corresponds to a first input mode of the UPS; and
a second boss disposed on a second bracket of the at least one bracket that corresponds to a first output mode of the UPS, wherein the first boss and the second boss form a foolproof structure, and wherein the first input mode of the UPS is incompatible with the first output mode of the UPS.

9. The copper bar component of claim 8, wherein the first input mode is a three-phase input, main path/bypass single-sourcing mode, and wherein the first output mode is the single-phase output mode.

10. The copper bar component of claim 1, wherein the plurality of copper bars that are fastened to the at least one bracket are molded into one using a mold.

11. A power system, comprising:
an uninterruptible power supply (UPS); and
a copper bar component, wherein the copper bar component comprises:
at least one bracket, wherein the at least one bracket is made of an insulating material and comprises at least one protruding part; and
a plurality of copper bars, wherein the plurality of copper bars are fastened to the at least one bracket, wherein the plurality of copper bars are configured to connect to an input wiring terminal or an output wiring terminal, wherein the input wiring terminal and the output wiring terminal are disposed on the enclosure, wherein the at least one protruding part is configured to be selectively coupled to a limiting hole on each of the plurality of copper bars, wherein an arrangement manner of the plurality of copper bars on the at least one bracket corresponds to the at least one input mode or one output mode of the UPS so as to switch the at least one input mode or one output mode of the UPS by replacing the copper bar component, and wherein the input mode is a single-phase input mode or a three-phase input mode, or wherein the output mode is a single-phase output mode or a three-phase output mode.

12. The power system of claim 11, wherein the plurality of copper bars are fastened to the at least one bracket by means of a fitting between the limiting hole disposed on each of the plurality of copper bars and the protruding part disposed on the at least one bracket.

13. The power system of claim 12, wherein the at least one bracket comprises an upper bracket and a lower bracket, wherein the protruding part is disposed on the upper bracket, wherein the limiting hole is disposed on the lower bracket, wherein the upper bracket is connected to the plurality of copper bars by using the protruding part, and wherein the plurality of copper bars are fastened between the upper bracket and the lower bracket by means of the fitting.

14. The power system of claim 11, further comprising a label disposed on the at least one bracket, wherein the label indicates the input mode or the output mode corresponding to the at least one bracket of the UPS.

15. The power system of claim 11, further comprising a foolproof structure disposed on at least one of the at least one bracket or the enclosure.

16. The power system of claim 11, further comprising a protruding rib disposed on the at least one bracket, wherein the at least one bracket corresponds to one output mode of the UPS, wherein a groove is disposed on the enclosure, wherein the protruding rib and the groove form a foolproof structure, and wherein the output mode and the input mode are differentiated by using a fitting between the protruding rib of the at least one bracket and the groove disposed on the enclosure.

17. The power system of claim 11, further comprising a protruding rib disposed on the at least one bracket, wherein the at least one bracket corresponds to one input mode of the UPS, wherein a groove is disposed on the enclosure, wherein the protruding rib and the groove form a foolproof structure, and wherein the output mode and the input mode are differentiated by using a fitting between the protruding rib of the at least one bracket and the groove disposed on the enclosure.

18. The power system of claim 11, further comprising:
a first boss disposed on a first bracket of the at least one bracket that corresponds to a first input mode of the UPS; and
a second boss disposed on a second bracket of the at least one bracket that corresponds to a first output mode of the UPS, wherein the first boss and the second boss form a foolproof structure, and wherein the first input mode of the UPS is incompatible with the first output mode of the UPS.

19. The power system of claim 18, wherein the first input mode is a three-phase input, main path/bypass single-sourcing mode, and wherein the first output mode is the single-phase output mode.

20. The power system of claim 11, wherein the plurality of copper bars that are fastened to the at least one bracket are molded into one using a mold.

* * * * *